United States Patent [19]
Yeh

[11] Patent Number: 6,100,569
[45] Date of Patent: Aug. 8, 2000

[54] SEMICONDUCTOR DEVICE WITH SHARED CONTACT

[75] Inventor: Wen-Kuan Yeh, Hsin-Chu, Taiwan

[73] Assignee: United Microelectronics Corp., Hsin-Chu, Taiwan

[21] Appl. No.: 09/272,431

[22] Filed: Mar. 19, 1999

[51] Int. Cl.$^7$ ...................................................... H01L 29/72
[52] U.S. Cl. .......................... 257/413; 257/369; 257/377; 257/382; 257/384; 257/388; 257/412; 257/755; 257/768
[58] Field of Search ...................................... 257/369, 384, 257/382, 377, 388, 412, 413, 768, 755

[56] References Cited

U.S. PATENT DOCUMENTS 5,757,045   5/1998   Tsai et al. ................................. 257/336

FOREIGN PATENT DOCUMENTS 6-177349   6/1994   Japan ...................................... 257/296

*Primary Examiner*—Edward Wojciechowicz
*Attorney, Agent, or Firm*—Harness, Dickey & Pierce, P.L.C.

[57] ABSTRACT

A static random access memory (SRAM) is disclosed. The SRAM includes a shared contact. A gate oxide layer is firstly formed on a semiconductor substrate, and a polysilicon layer is then formed on the gate oxide layer. A dielectric spacer abuts surface of the polysilicon layer of the SRAM except on a top surface of the expect on a top surface of the polysilicon layer of the SRAM. Moreover, first ions of a first conductive type are implanted between the substrate. And second ions of the first conductive type are implanted into substrate to form a source/drain region of a first gate, and a second gate without the source/drain region using the dielectric spacers as a mask. The SRAM has at least three silicidation regions abutting top surface of the source/drain region, and the first and second gate, and the side wall second gate with no space is also covered a silicidation region. Finally, an inter-layer dielectric (ILD) is deposited over the substrate. Using conventional photolithography techniques to define, the ILD layer is then patterned and etched to form a shared contact between the gate and source/drain regions, wherein the shared contact via is used to provide electrical coupling for both the source/drain of the first gate of the SRAM and second gate of the SRAM.

11 Claims, 4 Drawing Sheets

SEMICONDUCTOR DEVICE WITH SHARED CONTACT

BACKGROUND OF THE INVENTION

1. Field of the Invention

The present invention relates to a static random access memory (SRAM), and more particularly, to a SRAM with a shared contact for a small dimension semiconductor device.

2. Description of the Prior Art

Recently, demand for semiconductor devices has rapidly increased owing to widespread use of integrated electronic circuit. In particularly, static random access memory (SRAM) has become a basic and elementary component used in integrated circuits (ICs), such as semiconductor memory devices. More particularly, as more than hundreds or thousands of electrical components are integrated into the ICs, a means for scaling down the dimension of the SRAM and reducing fabrication cost has become imperative.

FIGS. 1A to 1F show cross-sectional views of a traditional static random access memory (SRAM), where the cross section shown in FIG. 1B has additional silicon oxide 250 and photo resist layer 270. An N-type semiconductor device, for example, has a source region 260A and a drain region 260B doped with N-type ions, and which usually designated as N⁺ regions. The substrate 100 usually has a P-type well, the gate 140 is composed of polysilicon, and the spacers 240. The cross section shown in FIG. 1C has the etched photo resist layer 270 and local spacer. Because the etched spacers result in the destruction of the lightly doped drain regions, the process of semiconductor devices was affected. The cross section shown in FIG. 1D has the formed source/drain regions 260A and 260B and has the etched local dielectrics 250. The cross section shown in FIG. 1E has additional silicidation regions 280A1, 280A2, 280B and 280C. Furthermore, the process of scaling down SRAM should also be correspondingly simplified. For the foregoing reasons, there is a need for a SRAM with small dimension and more simplification fabrication.

SUMMARY OF THE INVENTION

In accordance with the present invention, a static random access memory (SRAM) is provided for small dimension and more simplification fabrication. Primarily, the purpose of the present invention provides means for manufacturing a SRAM with this shared contact between the gate and drain regions, so that the provided SRAM can be adapted to small dimension and more simplification fabrication.

Another purpose of the present invention is to provide a SRAM with silicide extension technology so that this process is more simply.

A further purpose of the present invention is to provide a SRAM with the extension salicidation process, thereby obtaining large process margin of shared contact formation in SRAM.

Moreover, the present invention provides a SRAM with the shared contact, thus enhancing density of SRAM related process. Therefore, silicide extension technology with shared contact process was more compatible to form high density SRAM.

In one embodiment, the present invention provides a small dimension and more simplification fabrication static random access memory (SRAM), which includes a shared contact. A gate oxide layer is firstly on a semiconductor substrate, and a polysilicon layer is then formed on the gate oxide layer, which are as the gate of static random access memory. A dielectric layer abutting surface of the polysilicon layer except on a top surface of the gate and which one the side walls of the gate. A silicon nitride space is formed on the gate around side wall, wherein there is only one space formed on gate side wall. Moreover, first ions of a first conductive type are implanted between the substrate and the bottom of spacers. And second ions of the first conductive type are implanted into substrate using the dielectric spacers as a mask, wherein concentration of the implanted second ions is greater than concentration of the implanted first ions. The SRAM has at least three silicidation regions abutting top surface of the source/drain region and the polysilicon gate, and the side wall gate with no space is also covered a silicidation region. Finally, forming an inter-layer dielectric (ILD) is deposited over the substrate. Using conventional photolithography techniques to define, the ILD layer is then patterned and etched to form a shared contact between the gate and source/drain regions.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
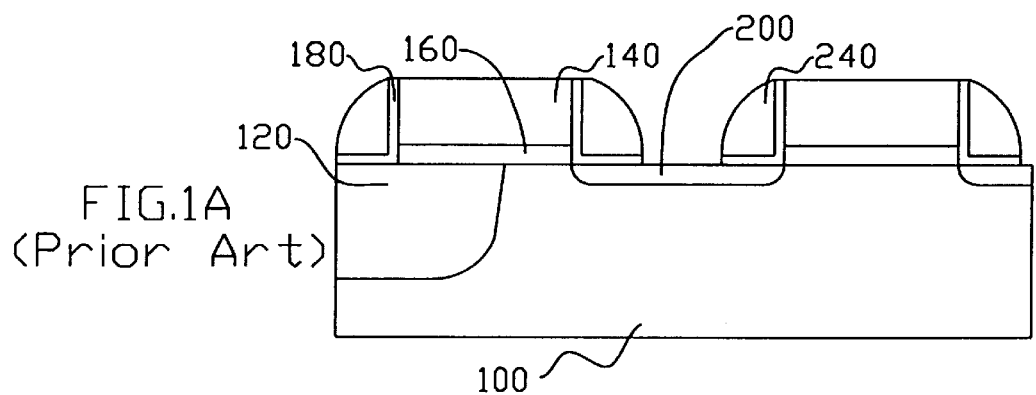
FIGS. 1A to 1F show cross-sectional views of a traditional static random access memory (SRAM)
Figure 1B:
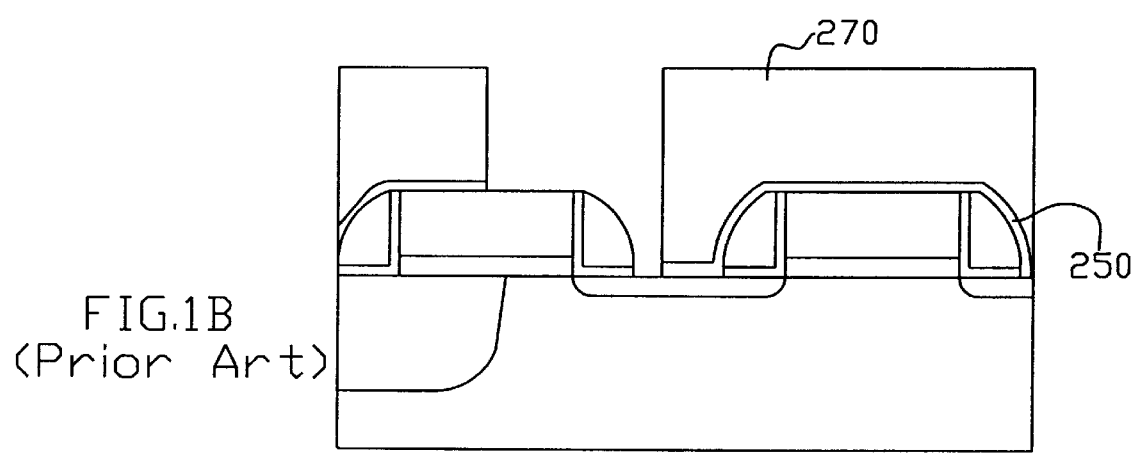
Figure 1C:
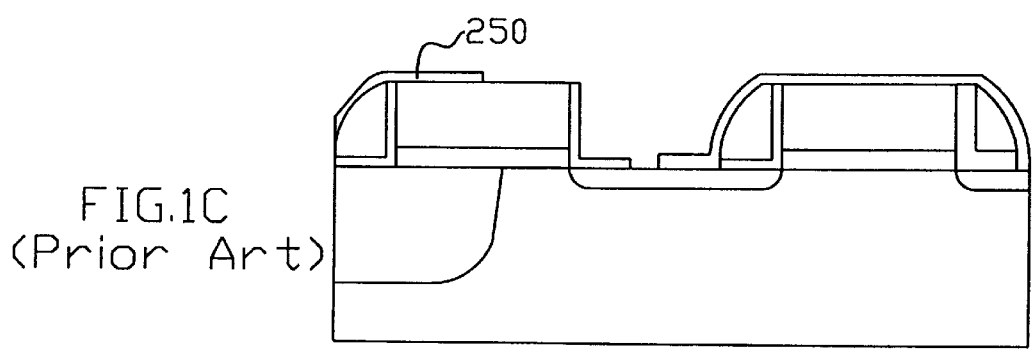
Figure 1D:
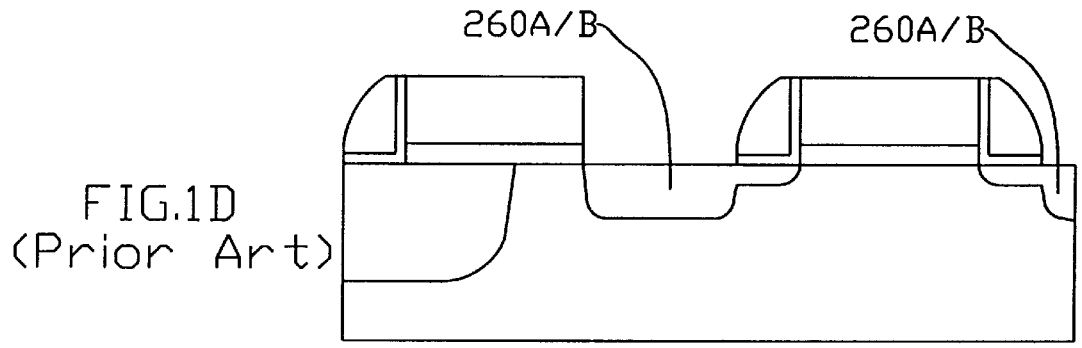
Figure 1E:
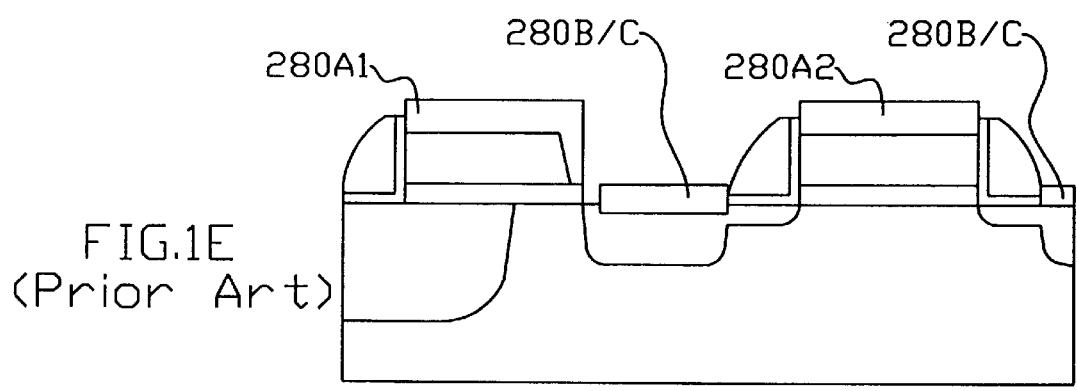
Figure 1F:
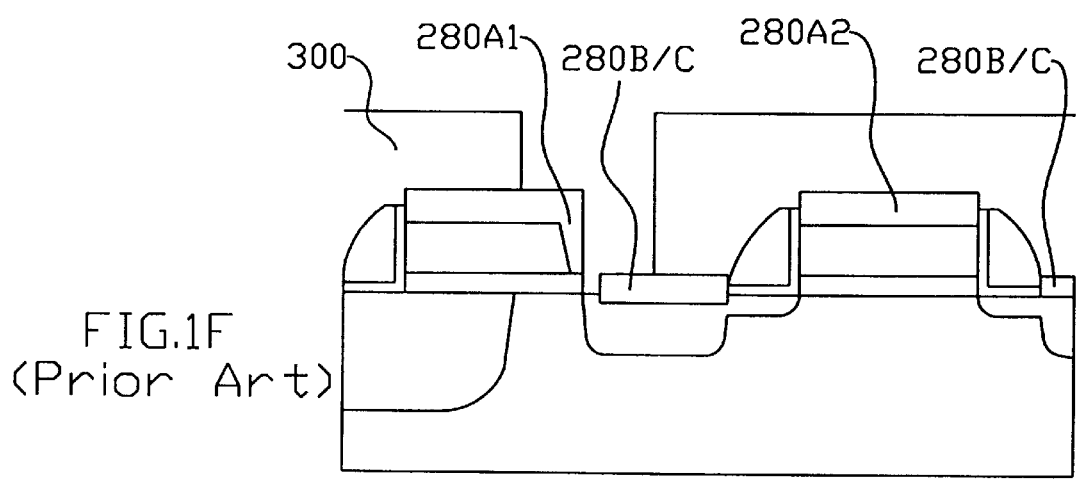
Figure 2:
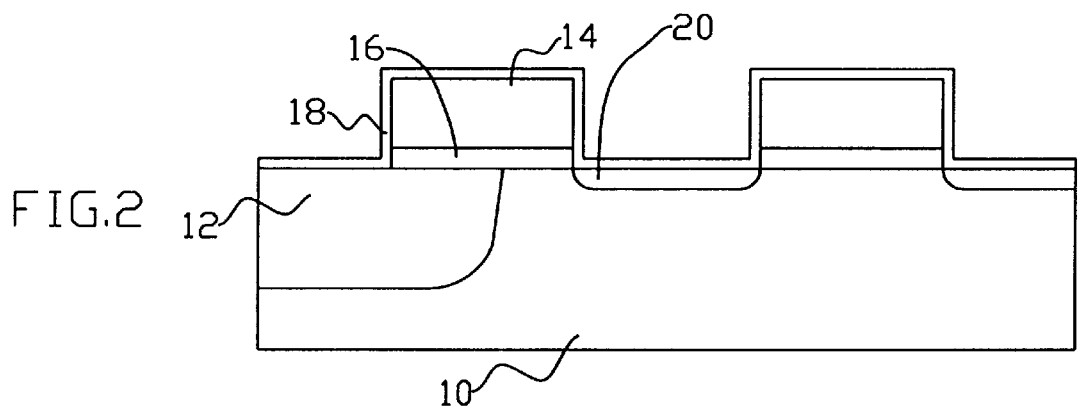
FIGS. 2 to 6 show cross-sectional views of various stages in the fabrication of a traditional static random access memory (SRAM) in accordance with one embodiment of the present invention.

Referring to FIG. 2, one shallow trench isolation (STI) regions 12, which are usually composed of silicon oxide, are formed in silicon substrate 10 by a traditional technique. Next, a gate oxide layer 16 is formed using a traditional thermal method to grow the silicon oxide on the surface 10, where a thickness of about 100–250 angstroms. Subsequently, a conventional low pressure chemical vapor deposition (LPCVD) is utilized to form a polysilicon layer 14 on the gate oxide 16. A polysilicon layer 14 with the thickness of the is preferably about 2000–3000 angstroms. Generally, the formation of the polysilicon layer 14 is implanted by doping ions, such as Phosphorus or Arsenic, thereinto, so that the resistivity of the gate 14 thus formed later can be substantially reduced. Using the gate of a static random access memory as a doping mask, ions such as Arsenic with concentration of about $10^{13}/cm^2$ are implanted into the substrate 10, generally followed by a thermal driving in and annealing in a temperature of about 900–1000° C., and is usually designated as N⁻. Two lightly doped regions 20 are thus formed. Further, a dielectric layer 18, such as tetraetheoxysilane (TEOS) layer, having about 200 angstroms in thickness is conformably deposited on the gate 14 and on the surface of the exposed substrate 10. In the embodiment, a low pressure chemical vapor deposition (LPCVD) is applied.

Figure 3:
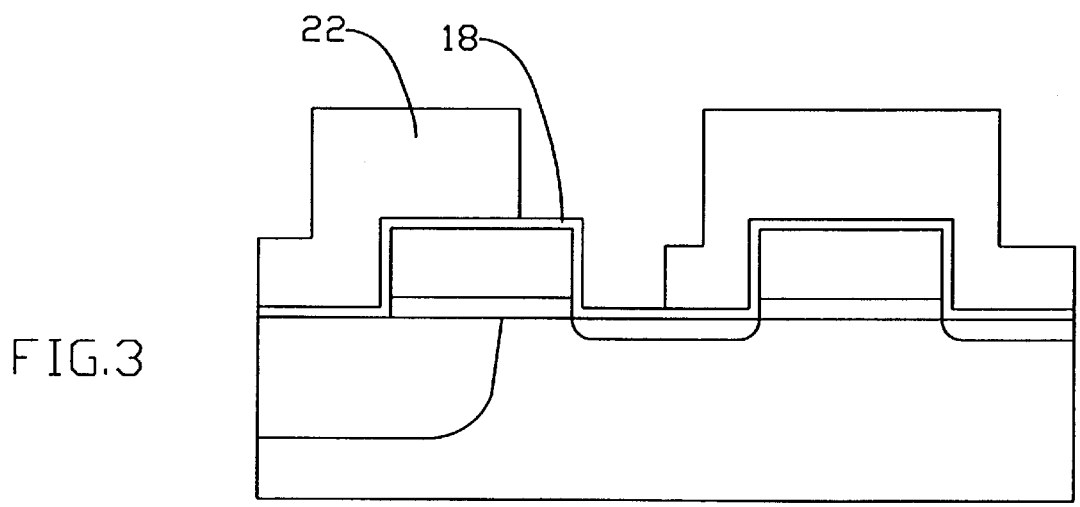

Referring to FIG. 3, the position of spacers is defined. Next, a silicon nitride layer 22 of about 1500 angstroms is deposited on the dielectric layer 18, by for example, a traditional low pressure chemical vapor deposition (LPCVD) method. However, a side wall gate, which is no space, is not deposited with silicon nitride.

Figure 4:
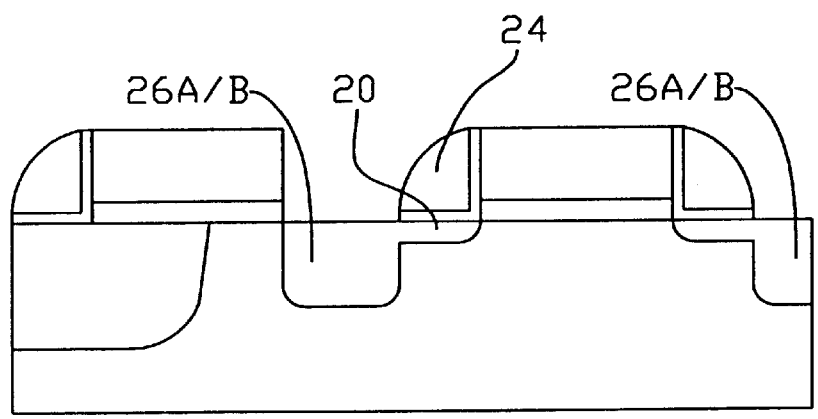

In the structure of FIG. 4, a dielectric spacer 24 is formed on the sidewalls of the gate consisting of silicon nitride by anisotropical etch technique, wherein there is only one space formed on gate side wall. Next, the dielectric layer is removed. Using the spacer 24 as a doping mask, N type ions such as Phosphorus or Arsenic with concentration of about $10^{15}/cm^2$ are implanted into the substrate 10, generally followed by a thermal driving in a temperature of about 900–1000° C., and is usually designated as $N^+$. Two heavily doped regions 26A and 26B are in the substrate 10. It is noted that the concentration of the heavily doped regions 26A and 26B is higher than the concentration of the lightly doped region 20 mentioned above.

Figure 5:
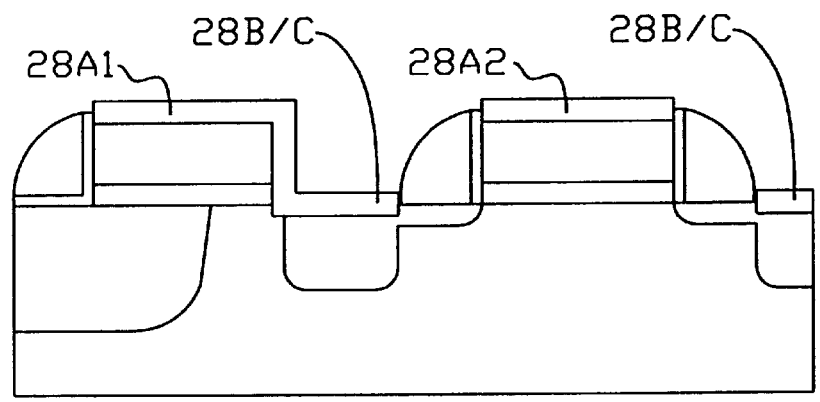

Referring to the FIG. 5, three silicidation regions 28A1, 28A2, 28B and 28C are formed on the gate 14, the source/drain 26A and 26B, respectively. This silicidation is performed by a traditional process such as self-aligned silicidation (or salicide), which generally includes firstly blanket sputtering a metal Titanium or Cobalt layer over the substrate 10, followed by subjecting the substrate 10 in a high temperature. It makes the metal layer react with the underlying silicon substrate 10, thereby forming silicide region on the gate 14, the source 26A and the drain 26B, respectively. Those regions not reacted with the metal layer are then removed by, for example, a conventional wet etch.

Figure 6:
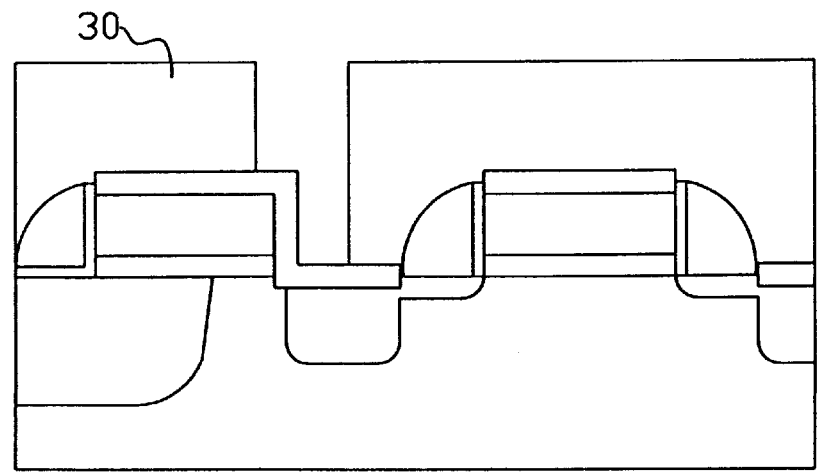

Finally, referring FIG. 6, an inter-layer dielectric 30 (ILD) such as silicon nitride layer is deposited over the substrate 10. Using conventional photolithography techniques to define a shared contact via, the inter-layer dielectric layer 30 is then patterned and etched to form a shared contact via therein. Conductive material are then refilled inside the contact via to form contact plug, generally followed by a planarization process such as chemical mechanical polishing (CMP).

According to the aforementioned process of the present invention, a SRAM with a shared contact is provided, so that the provided SRAM can be obtained to small dimension and more simplification fabrication. Further, the present invention is to provide a SRAM with silicide extension technology so that this process is more simplied. Moreover, the extension salicidation process in the SRAM according to the present invention, thereby obtaining large process margin of shared contact formation in SRAM.

Although specific embodiments have been illustrated and described, it will be obvious to those skilled in the art that various modifications may be made without departing from what is intended to be limited solely by the appended claims.

What is claimed is:

1. A static random access memory (SRAM), comprising:
   an isolation formed in a semiconductor substrate;
   at least two gate oxide layers formed on the semiconductor substrate, one of said gate oxide being spaced from another of said gate oxide;
   at least two polysilicon layers formed on the gate oxide layers respectively, one of said polysilicon layers being spaced from another of said polysilicon layers, resulting in a first gate and a second gate;
   at least a dielectric spacer abutting sidewall of said polysilicon layer of the first gate, wherein at least a portion of sidewall of the second gate is not covered by the dielectric spacer;
   first ions of a first conductive type implanted into said semiconductor substrate;
   second ions of the first conductive type implanted into said semiconductor substrate to form a source/drain region of the first gate using said dielectric spacer as a mask, wherein concentration of said implanted second ions is greater than concentration of said implanted first ions;
   a plurality of silicidation regions abutting top surface of said implanted second ions, said first gate, and the sidewall of said second gate; and
   an inter-layer dielectric deposited over the semiconductor substrate, wherein inter-layer dielectric is etched to form a shared contact via therein, wherein said share contact via is used as an electrically coupling path for both the source/drain region of the first gate and the second gate.

2. The SRAM according to claim 1, wherein said spacer comprises silicon nitride.

3. The SRAM according to claim 1, wherein said isolation comprises silicon oxide.

4. The SRAM according to claim 1, wherein said silicidation regions are formed by a self-aligned silicidation process.

5. The SRAM according to claim 4, wherein said silicidation regions comprise Titanium.

6. The SRAM according to claim 1, wherein said silicidation regions comprise metal Cobalt.

7. The SRAM according to claim 1, wherein said inter-layer dielectric comprises silicon oxide.

8. A static random access memory (SRAM), comprising:
   a shallow trench isolation formed in a semiconductor substrate;
   at least two gate oxide layers formed on the semiconductor substrate, one of said gate oxide being spaced from another of said gate oxide;
   at least two polysilicon layers formed on the gate oxide layers respectively, one of said polysilicon layer being spaced from another of said polysilicon layer, resulting in a first gate and a second gate;
   at least a dielectric spacer abutting sidewall of said polysilicon layer of the first gate, wherein at least a portion of sidewall of the second gate is not covered by the dielectric spacer;
   first ions of a first conductive type implanted into said semiconductor substrate;
   second ions of the first conductive type implanted into said semiconductor substrate to form a source/drain region of the first gate using said dielectric spacer as a mask, wherein concentration of said implanted second ions is greater than concentration of said implanted first ions;
   a plurality of silicidation regions abutting top surface of said implanted second ions, said gate, and the sidewall of the second gate;
   an inter-layer dielectric deposited over the semiconductor substrate, wherein inter-layer dielectric is etched to form a shared contact via therein, wherein said share contact via is used as an electrically coupling path for both the source/drain of the first gate and the second gate; and
   a conductive material refilled inside said shared contact via to form a contact plug, wherein said contact plug electrically couples both the source/drain region of the first gate and the second gate.

9. The SRAM according to claim 8, wherein said gate oxide layers are formed by a thermal oxide method.

10. The SRAM according to claim 8, wherein said polysilicon layers are doped with ions Phosphorus or Arsenic.

11. The SRAM according to claim 8, wherein said silicidation regions are formed by sputtering Titanium, reacting said Titanium with said semiconductor substrate.

* * * * *